(12) United States Patent
Cho et al.

(10) Patent No.: US 9,768,046 B2
(45) Date of Patent: Sep. 19, 2017

(54) WAFER STORAGE CONTAINER

(71) Applicant: SAMSUNG ELECTRONICS CO., LTD., Suwon-si, Gyeonggi-do (KR)

(72) Inventors: Hyun-Ho Cho, Suwon-si (KR); Hyeog-Ki Kim, Hwaseong-si (KR); Jung-Hun Nam, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 408 days.

(21) Appl. No.: 14/540,154

(22) Filed: Nov. 13, 2014

(65) Prior Publication Data
US 2015/0311098 A1    Oct. 29, 2015

(30) Foreign Application Priority Data

Apr. 29, 2014 (KR) ........................ 10-2014-0051677

(51) Int. Cl.
*G01R 31/00* (2006.01)
*H01L 21/673* (2006.01)

(52) U.S. Cl.
CPC .. *H01L 21/67383* (2013.01); *H01L 21/67379* (2013.01)

(58) Field of Classification Search
CPC ............ G01R 31/2856; G01R 31/2875; G01R 31/2877; G01R 1/04; G01R 1/0408; G01R 1/0433; G01R 1/0491; G01R 1/06744; G01R 1/073; G01R 1/07342; G01R 31/2601; G01R 31/2886; G01R 31/2887; G01R 31/2891
See application file for complete search history.

(56) References Cited

U.S. PATENT DOCUMENTS

| | | | |
|---|---|---|---|
| 5,110,001 A | 5/1992 | Dunn | |
| 5,706,946 A | 1/1998 | Kakizaki et al. | |
| 6,214,122 B1* | 4/2001 | Thompson | ........ H01L 21/67103 118/500 |
| 6,736,268 B2* | 5/2004 | Nyseth | .............. H01L 21/67373 206/454 |
| 6,776,289 B1 | 8/2004 | Nyseth | |
| 6,945,405 B1 | 9/2005 | Bores et al. | |
| 7,017,750 B2 | 3/2006 | Matsutori et al. | |
| 7,347,329 B2 | 3/2008 | Burns et al. | |
| 7,357,257 B2 | 4/2008 | Matsutori et al. | |
| 7,383,955 B2 | 6/2008 | Matsutori et al. | |
| 7,410,061 B2 | 8/2008 | Matsutori et al. | |
| 7,497,333 B2 | 3/2009 | Matsutori et al. | |

(Continued)

FOREIGN PATENT DOCUMENTS

| | | |
|---|---|---|
| KR | 10-2004-00606805 A | 7/2004 |
| KR | 10-2006-0106145 A | 10/2006 |

(Continued)

*Primary Examiner* — Tung X Nguyen
(74) *Attorney, Agent, or Firm* — Lee & Morse P.C.

(57) ABSTRACT

A wafer storage container includes a shell body including a first side body and a second side body that face, an upper body connected with upper parts of the first side body and the second side body, a rear body connected with an end of one side of each of the first side body and the second side body, and a lower body connected with lower parts of the first side body and the second side body, and configured to define an internal space together with the first side body, the second side body, the upper body, and the rear body.

20 Claims, 20 Drawing Sheets

(56) References Cited

U.S. PATENT DOCUMENTS

| | | | |
|---|---|---|---|
| 7,520,388 | B2 | 4/2009 | Matsutori et al. |
| 8,464,872 | B2 | 6/2013 | Inoue |
| 2006/0272973 | A1 | 12/2006 | Matsutori et al. |
| 2009/0002966 | A1* | 1/2009 | Hosokawa ........ H01L 21/67383 |
| | | | 361/809 |

FOREIGN PATENT DOCUMENTS

| | | |
|---|---|---|
| KR | 10-1165611 B1 | 7/2012 |
| WO | WO 2011/132257 A1 | 4/2010 |

* cited by examiner

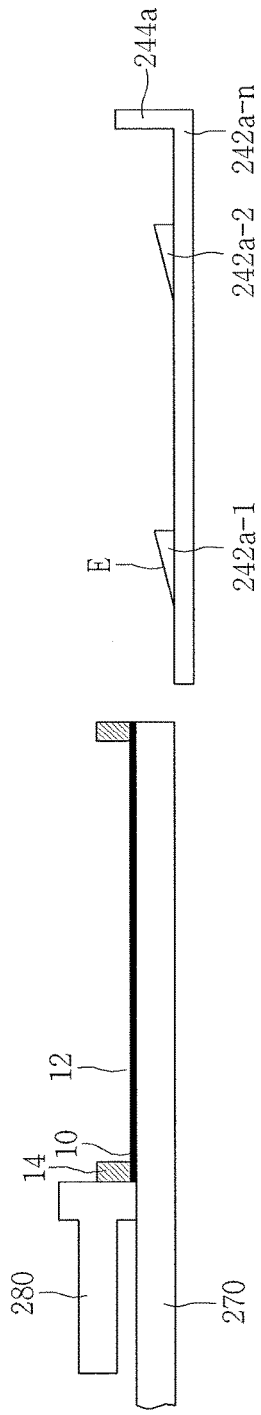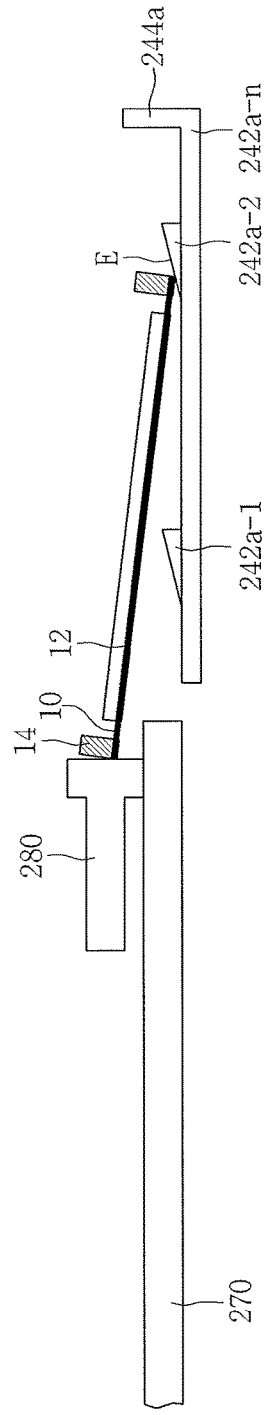

WAFER STORAGE CONTAINER

CROSS-REFERENCE TO RELATED APPLICATION

This application claims priority under 35 U.S.C. §119 to Korean Patent Application No. 10-2014-0051677, filed on Apr. 29, 2014, the disclosure of which is hereby incorporated by reference in its entirety.

BACKGROUND

Technical Field

Embodiments relate to a container capable of storing wafers used in a semiconductor device manufacturing process.

Description of Related Art

Wafers used in a semiconductor device manufacturing process may be moved to unit-process equipment from a wafer storage container, e.g., a front opening unified pod (FOUP) or the like, and unloaded back into the wafer storage container after the unit process is completed.

SUMMARY

In accordance with an embodiment, a wafer storage container includes a shell body having a first side body and a second side body that face each other and are spaced apart from each other, an upper body connected with upper parts of the first side body and the second side body, a rear body connected with an end of one side of each of the first side body and the second side body, and a lower body connected with lower parts of the first side body and the second side body, and the lower body defining an internal space together with the first side body, the second side body, the upper body, and the rear body, a holder on the upper body, a first handler on an edge region between the upper body and the first side body, the first handler protruding from the lower body in a direction of the upper body, a second handler on an edge region between the upper body and the second side body, the second handler protruding from the lower body in the direction of the upper body, a first slot on a first inner wall of the first side body exposed by the internal space, and a second slot on a second inner wall of the second side body exposed by the internal space, each of the first slot and the second slot including a plurality of individual slot guides and a plurality of supporters on the individual slot guides.

Each of the first handler and the second handler may include a sub-handler combined with the shell body, and a main handler located above the sub-handler.

The wafer storage container may further include an opening between the main handler and the sub-handler, the main handler having a bar shape, which is to be gripped by an operator's hand, through the opening.

The sub-handler may have a shape of a groove at a lower part of the main handler relative to the opening.

The main handler may be at a height above a surface of the upper body of the shell body.

The first handler and the second handler may be parallel with the first side body and the second side body, respectively.

Each of the supporters may have a sloped surface gradually inclining from a wafer entryway of the shell body toward the rear body of the shell body.

Each of the supporters may retain a predetermined angle relative to a surface of a corresponding individual slot guide.

Each of the supporters having the sloped surfaces may have a peak point to minimize a contact surface with a wafer.

In accordance with another embodiment, a wafer storage container includes a shell body having a first side body and a second side body that face each other and are spaced apart from each other, an upper body connected with upper parts of the first side body and the second side body, a rear body connected with an end located on one side of each of the first side body and the second side body, and a lower body connected with lower parts of the first side body and the second side body, the lower body defining an internal space with the first side body, the second side body, the upper body, and the rear body, a holder on the upper body, a first handler on an edge region between the upper body and the first side body, the first handler protruding from the lower body in a direction of the upper body, a second handler on an edge region between the upper body and the second side body, the second handler protruding from the lower body in the direction of the upper body, a first slot on a first inner wall of the first side body exposed by the internal space, and a second slot on a second inner wall of the second side body exposed by the internal space, each of the first slot and the second slot including a plurality of individual slot guides and a plurality of supporters on the individual slot guide, and each of the supporters having a sloped surface gradually inclining from a wafer entryway of the shell body toward the rear body of the shell body.

Each of the supporters may have a same height and sloped surface.

The sloped surface of each of the supporters may retain a predetermined angle relative to a surface of a corresponding individual slot guide.

Each of the supporters on the individual slot guides may have a peak point, which minimizes a contact surface with a wafer, at an end of the sloped surface.

The wafer storage container may further include a stopper at an end of each of the individual slot guides, the stopper being capable of preventing a wafer, unloaded into the shell body, from deviating from the individual slot guide.

Each of the first handler and the second handler may include a sub-handler combined with the shell body, and a main handler above the sub-handler, and the main handler being at a height above a surface of the upper body of the shell body.

In accordance with yet another embodiment, a wafer storage container includes a shell body, a first slot on a first inner wall of the shell body, and a second slot on a second inner wall of the shell body, each of the first slot and the second slot including a plurality of individual slot guides and a plurality of supporters on the individual slot guide, and each of the supporters having a sloped surface gradually inclining from a wafer entryway of the shell body toward the rear body of the shell body.

An inclination angle of the sloped surface may be about 45 degree or less.

Each of the supporters having the sloped surfaces may have a peak point minimizing a contact surface with a wafer.

Each of the supporters may have a same height.

Each of the individual slot guides may further include a stopper capable of preventing a wafer, unloaded into the shell body, from deviating from the individual slot guide.

BRIEF DESCRIPTION OF THE DRAWINGS

The foregoing and other features and advantages will be apparent from the more particular description of preferred embodiments, as illustrated in the accompanying drawings in which like reference characters refer to the same parts throughout the different views. The drawings are not necessarily to scale, emphasis instead being placed upon illustrating the principles of the embodiments. In the drawings:

FIGS. 20A to 20C illustrate a process in which a wafer is unloaded into the wafer storage container according to an embodiment.

DETAILED DESCRIPTION OF THE EMBODIMENTS

Embodiments will now be described more fully hereinafter with reference to the accompanying drawings, in which exemplary embodiments are shown. Embodiments may, however, be embodied in different forms and should not be construed as limited to those set forth herein. Rather, these embodiments are provided so that this disclosure is thorough and complete and fully conveys exemplary implementations to one skilled in the art.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, the embodiments will be described with reference to cross-sectional views, plan views, and block diagrams, which are ideal exemplary views. Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Hereinafter, a structure of a wafer storage container will now be described more fully with reference to the accompanying drawings, in which embodiments are shown.

Figure 1:
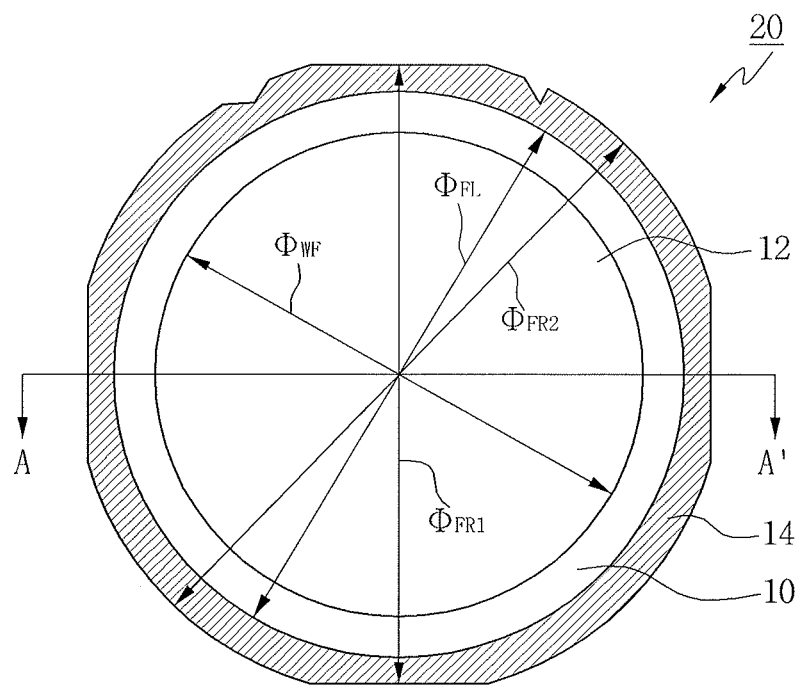
FIG. 1 is a plan view of a tape-frame-type wafer capable of storing in a wafer storage container in accordance with an embodiment.
Figure 2:
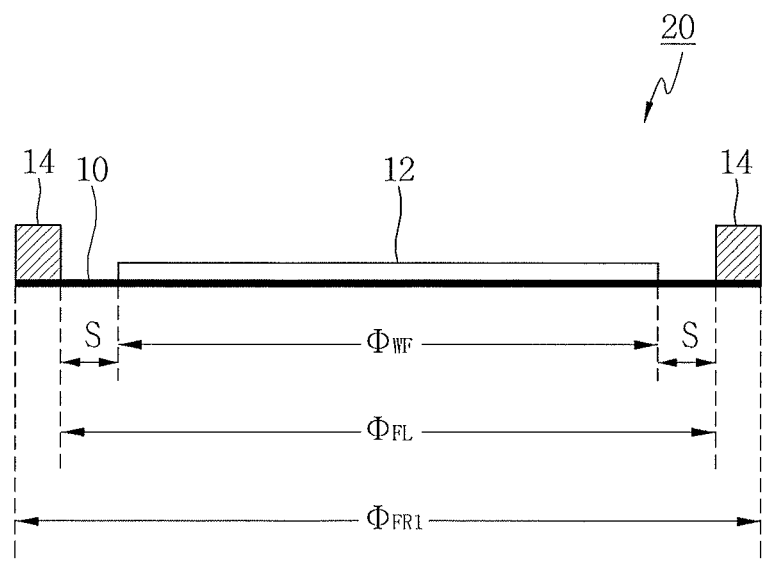
FIG. 2 is a cross sectional view of the tape-frame-type wafer capable of storing in the wafer storage container in accordance with the embodiment.

FIG. 1 illustrates a plane structure of a tape-frame-type wafer 20 capable of being stored in a wafer storage container in accordance with an embodiment. FIG. 2 illustrates a cross sectional structure of the tape-frame-type wafer 20 along line A-A' in FIG. 1.

Referring to FIGS. 1 and 2, a wafer 12 may be bonded onto a film 10. A tape frame 14 may be bonded onto an outside of the wafer 12. The film 10 may be partly exposed between the wafer 12 and the tape frame 14. The film 10 may have a diameter $\Phi_{FL}$.

The tape frame 14, which surrounds the wafer 12, may have a first diameter $\Phi_{FR1}$ as a nearer distance and a second diameter $\Phi_{FR2}$ as a longer distance. The first diameter $\Phi_{FR1}$ and the second diameter $\Phi_{FR2}$ of the tape frame 14 may be greater than a diameter $\Phi_{WF}$ of the wafer 12.

As the tape frame 14 may be bonded to prevent damage to the wafer 12, the tape frame 14 may be spaced apart from the wafer 12 by a predetermined space S. As the tape frame 14 may be formed to protect the wafer 12, the tape frame 14 may have a greater thickness than the wafer 12.

In a case of the tape-frame-type wafer 20 in which the tape frame 14 is formed on the outside of the wafer 12, a wafer bonded with the tape frame 14 may be unloaded into the wafer storage container.

In an embodiment, sizes of the film 10 and the tape frame 14 are included in a size of the tape-frame-type wafer 20 in which the tape frame 14 is formed on the outside of the wafer 12, thereby the entire size of the tape-frame-type wafer 20 may be greater than the wafer 12. To store such the tape-frame-type wafer 20, it is required a shell has a greater size than the wafer storage container capable of storing a general wafer. Thereby, it prevents an increase in the entire external size of the entire wafer storage container including the shell and the handler, and increases compatibility with a conventional load port used to a wafer of, for example, a 300 mm diameter and an overhead hoist transport (OHT). Thus, an additional equipment investment cost may be reduced.

In formation of a supporter of a slot formed on an inside of a shell body and configured to support an unloaded wafer in accordance with the embodiment, a side of the supporter is formed to be sloped from a direction of a wafer entryway (front surface), in which a wafer enters, for useful for wafer sliding, thereby preventing a wafer loss. Hereinafter, a structure of the wafer storage container capable of storing the tape-frame-type wafer 20, in which the tape frame 14 is formed, or a large-caliber wafer greater than 300 mm will be described in accordance with an embodiment.

FIGS. 3 to 12 are views for describing a wafer storage container 100 in accordance with an embodiment.

Figure 3:
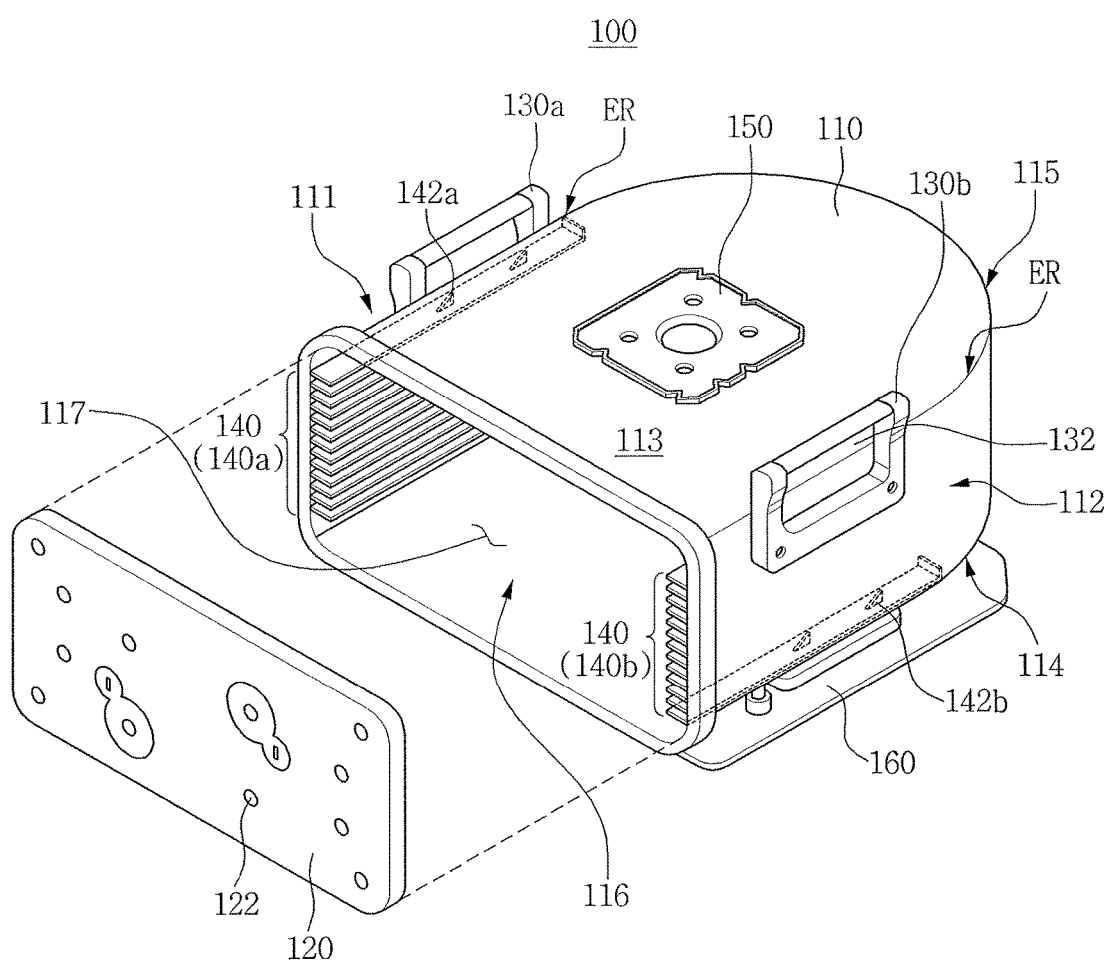
FIG. 3 is an external perspective view of an entire wafer storage container in accordance with an embodiment.
Figure 4:
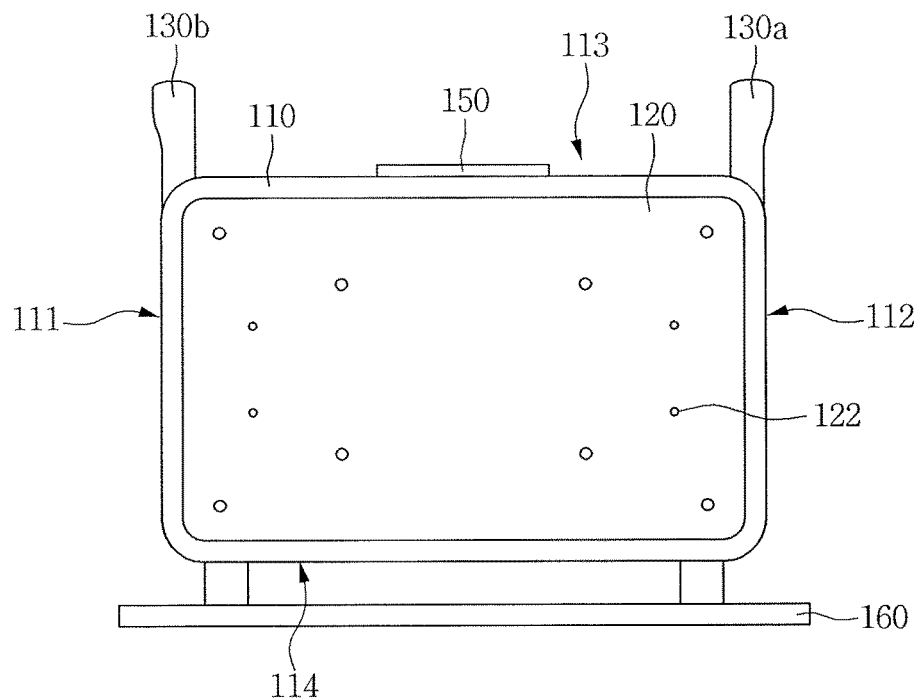
FIG. 4 is a front view of the wafer storage container according to an embodiment.
Figure 5:
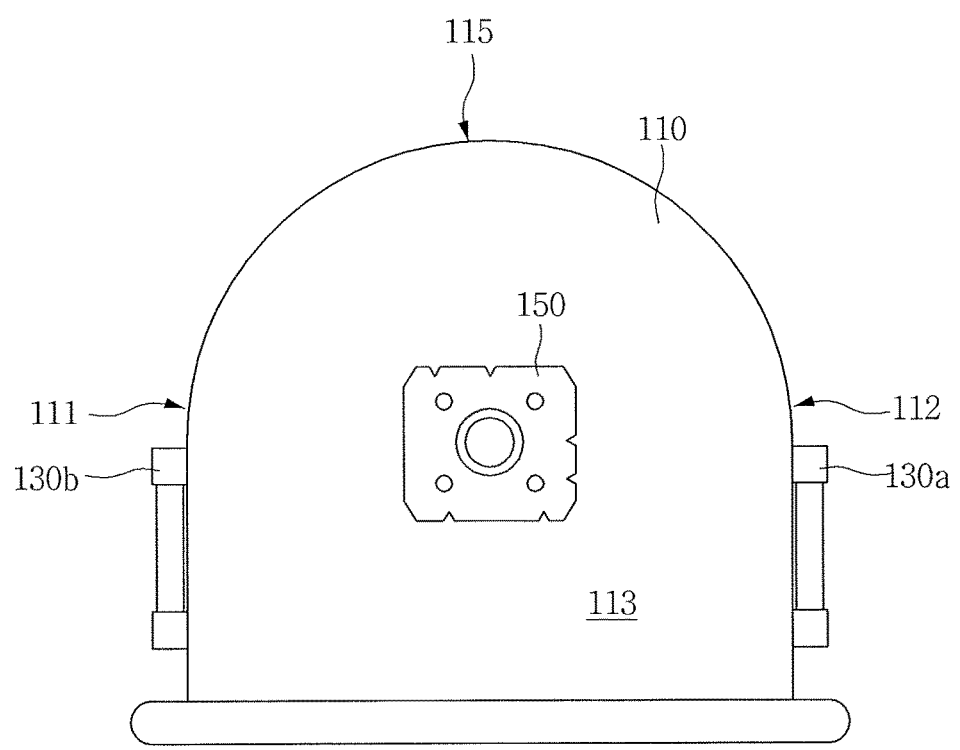
FIG. 5 is a plan view of the wafer storage container according to an embodiment.
Figure 6:
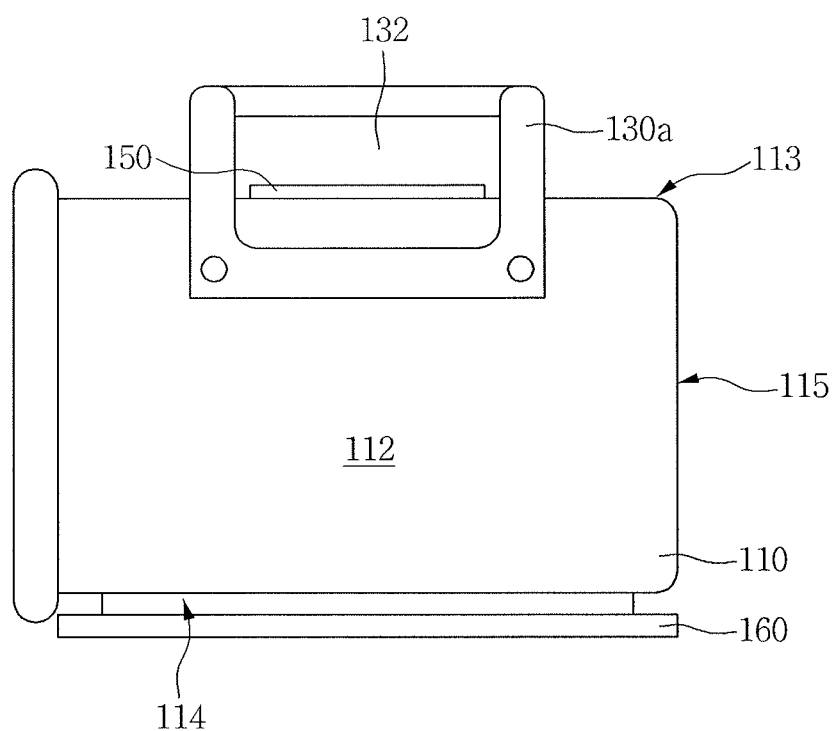
FIG. 6 is a side view of the wafer storage container according to an embodiment.
Figure 7:
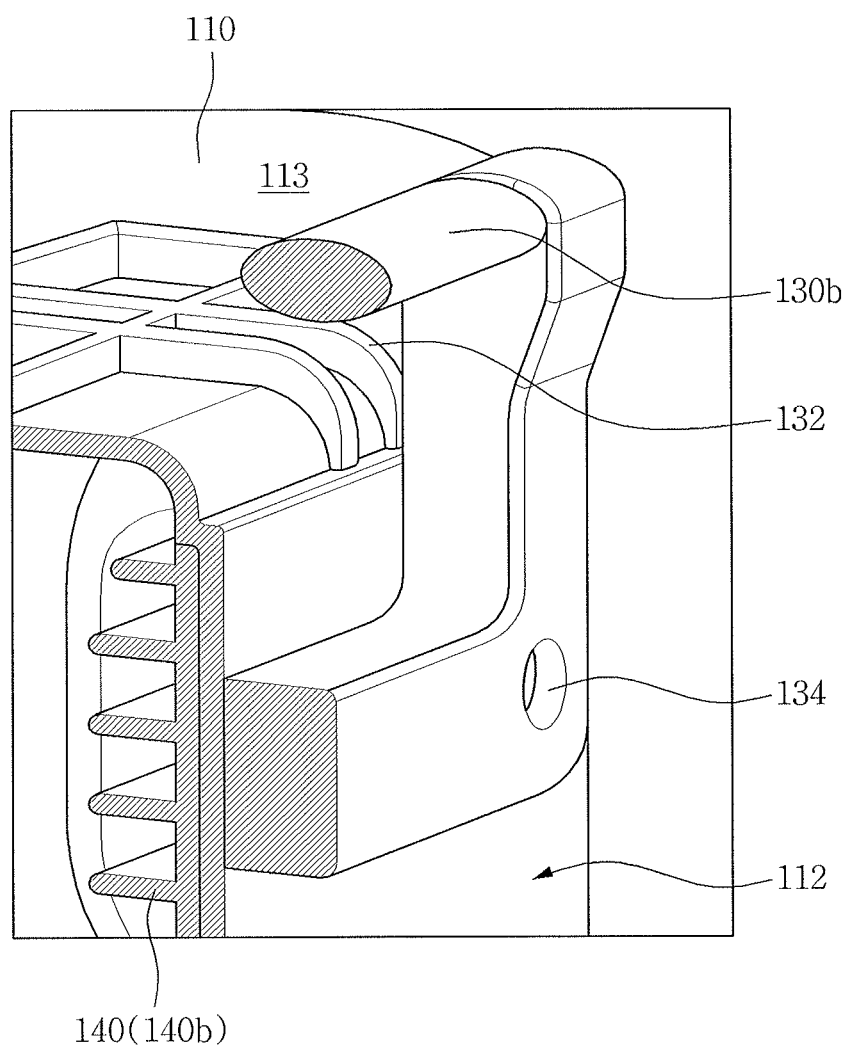
FIG. 7 is an enlarged view of a handler in the wafer storage container according to an embodiment.

FIG. 3 is an external view (perspective view) of an entire wafer storage container 100 in accordance with an embodiment. FIG. 4 is a front view of the wafer storage container 100. FIG. 5 is a plan view of the wafer storage container 100. FIG. 6 is a side view of the wafer storage container 100. FIG. 7 is an enlarged cross sectional view of a handler 130b in the wafer storage container 100.

Referring to FIGS. 1-7, the wafer storage container 100 according to the embodiment may include a shell body 110, a shell door 120, a first handler 130a, the second handler 130b, slots 140 (140a and 140b). The wafer storage container 100 may further include a holder 150 and a bottom plate 160.

The shell body 110 may include a first side body 111 and a second side body 112 which are faced and spaced apart from each other. The shell body 110 may include an upper body 113 connected with upper parts of the first side body 111 and the second side body 112. The shell body 110 may include a lower body 114 connected with lower parts of the first side body 111 and the second side body 112. The shell body 110 may include a rear body 115 which defines an internal space 117 together with the first side body 111, the second side body 112, the upper body 113, and the lower body 114. The shell body 110 may include a wafer entryway 116 in which a wafer enters into the internal space 117 defined by the first side body 111, the second side body 112, the upper body 113, the lower body 114, and the rear body 115.

As the shell door 120 is a device to seal the shell body 110, the shell door 120 may be implemented to be opened by a door switchgear, e.g., a robot arm. The shell door 120 may include a packing process to seal the shell body 110. The shell door 120 may include a plurality of combination members 122 to combine with the robot arm.

The first handler 130a and the second handler 130b may include openings 132. The openings 132 in the first handler 130a and the second handler 130b may have closed forms. The first handler 130a and the second handler 130b may be formed on a left side surface and a right side surface of the shell body 110, respectively.

In the embodiment, the terms "left side surface" and "right side surface" may denote side surfaces corresponding to each other in the shell body 110. Embodiments, however, are not limited to terms "left" and "right," and the terms "left side surface" and "right side surface" may refer to as the terms "first side" and "second side," respectively.

The first handler 130a and the second handler 130b may be disposed on upper ends of both side surfaces of the shell body 110. The first handler 130a and the second handler 130b may be formed in edge regions ER where the side surfaces contact an upper surface in the shell body 110.

The first handler 130a may be disposed on the edge region between the upper body 113 and the first side body 111, and formed to protrude from the lower body 114 in a direction of the upper body 113. The second handler 130b may be disposed on the edge region between the upper body 113 and the second side body 112, and formed to protrude from the lower body 114 in the direction of the upper body 113.

The first handler 130a and the second handler 130b may have bar shapes which may be gripped by an operator. The first handler 130a and the second handler 130b having the bar shapes may be gripped by an operator's hand through the opening 132. The first handler 130a and the second handler 130b may be formed to have an equal or similar height to the upper body 113 of the shell body 110, or to protrude above the surface of the upper body 113 of the shell body 110 in order to maximize a space where the operator's hand passing through the opening 132 may be positioned.

The slot 140 may include a first slot 140a and a second slot 140b which are formed on a left side surface and a right side surface of an inside of the shell body 110, respectively. The first slot 140a and the second slot 140b may include a plurality of individual slot guides formed to be horizontal to each other.

Each of the individual slot guides in the first slot 140a and the second slot 140b may include a plurality of supporters 142a and 142b having sloped surfaces of acute angles. A structure of the slot 140 having the supporters 142a and 142b will be described with reference to FIGS. 8 and 9.

The holder 150 may be formed at a center of the upper surface of the shell body 110. The holder 150 may be combined with a transfer system such as a manual transfer system, e.g., a personal guided vehicle (PGV), or an auto transfer system, e.g., an OHT, an overhead camshaft (OHC), an automated guided vehicle (AGV), etc.

The bottom plate 160 may be formed in a lower part region of the shell body 110. The bottom plate 160 may be a fixing device which may fix the wafer storage container 100 to a load port.

Referring back to FIG. 7, it illustrates a part of one side (right side) of the shell body 110 based on FIG. 3. The second slot 140b, which is one of slots 140 where a wafer is seated, located at an inner wall and the right side of the shell body 110 is illustrated.

As illustrated in FIG. 7, the second handler 130b may include the opening 132 and a joint 134. The second handler 130b may be disposed on an edge region between the upper body 113 and the second side body 112 in the shell body 110. The second handler 130b may have a parallel part with the second side body 112.

The second handler 130b is a region directly gripped by using an operator's hand in order to move the wafer storage container 100 when performing a manufacturing process of a semiconductor device. Accordingly, the second handler 130b may have a bar type having a circular or elliptical shape, which has no edges, in order to prevent damage to the operator's hand by a heavy weight of the wafer storage container 100 and to have excellent grip comfort.

The second handler 130b having the bar shape may be gripped by the operator's hand through the opening 132. The second handler 130b may be formed to have an equal or similar height to the upper body 113 of the shell body 110, or to protrude above the surface of the upper body 113 of the shell body 110 in order to maximize a space where the operator's hand passing through the opening 132 may be positioned.

As described above, in the wafer storage container 100 according to the embodiment, sizes of the handlers 130 become to have a small portion of the size of the entire wafer storage container 100 by disposing the handlers 130a and 130b, which move the wafer storage container 100, in the edge regions between the side bodies 111 and 112 and the upper body 113 in the shell body 110. As a result, even when a size of the shell body 110, in which a wafer is stored, increases, caused by an increase in a size of the wafer, it prevents an increase in the external size of the entire wafer storage container 100 by reducing the sizes of the handlers 130a and 130b. Therefore, a manual operation by the operator may be easily performed and an additional equipment investment cost may also be reduced by increasing compatibility with conventional equipment.

Figure 8:
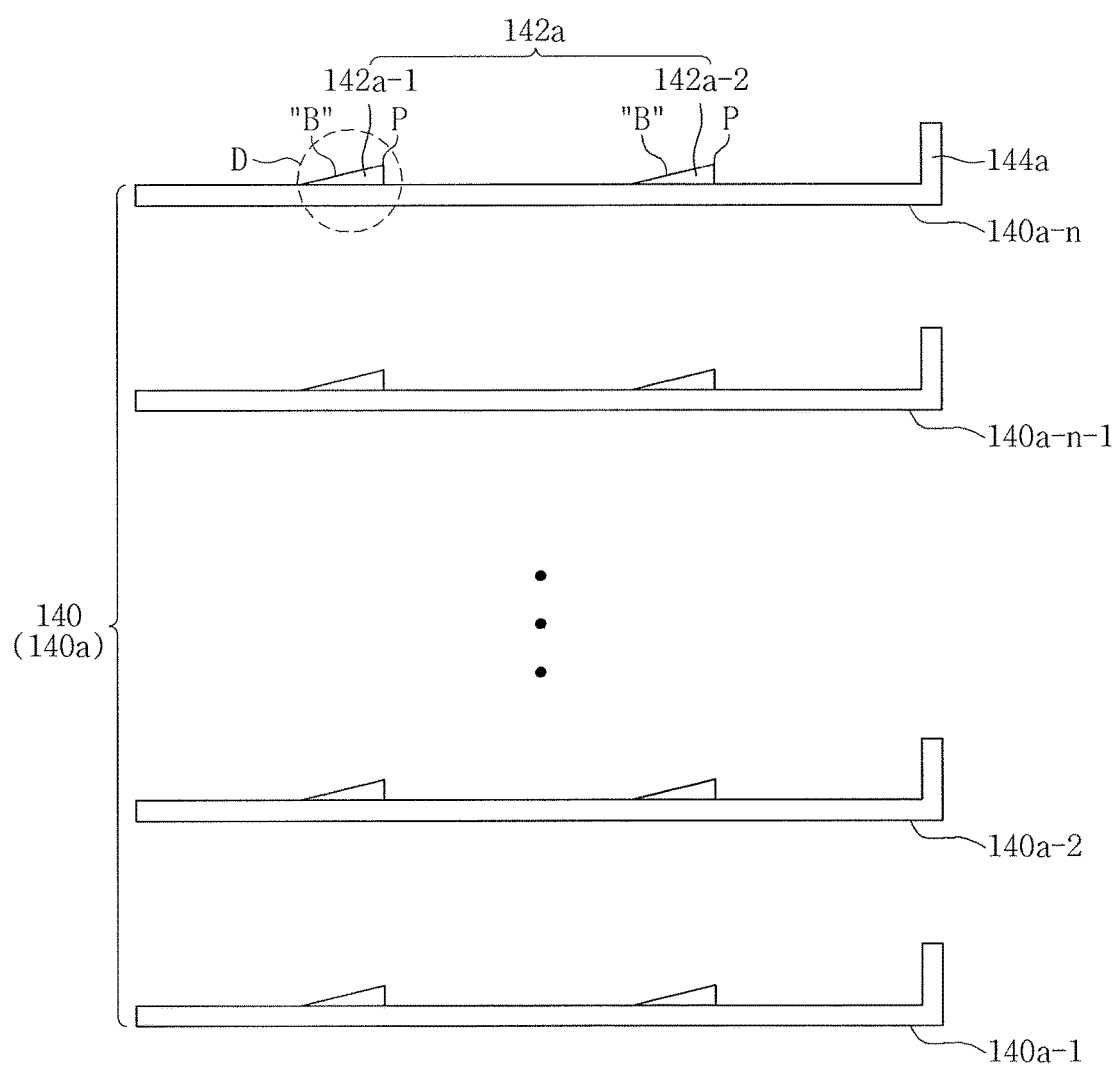
FIG. 8 illustrates a slot structure of one side of the wafer storage container according to an embodiment.

FIG. 8 illustrates a structure of the first slot 140a formed on a first inner wall of the wafer storage container 100.

Referring to FIGS. 3 and 8, the first slot 140a is formed on a first sidewall of the internal space 117 formed by the first side body 111, the second side body 112, the upper body 113, the lower body 114, and the rear body 115. The first slot 140a may include individual slot guides 140a-1 to 140a-n based on a weight of a wafer to be unloaded. Each of the individual slot guides 140a-1 to 140a-n may include the supporter 142a, which support a wafer, and a stopper 144a.

The supporter 142a may include a first supporter 142a-1 formed adjacent to the wafer entryway 116, where the wafer enters, of the shell body 110, and a second supporter 142a-2 located at the back of the first supporter 142a-1. The supporter 142a may include a plurality of supporters on the slot guide to retain a horizontal posture of the wafer.

The first supporter 142a-1 and the second supporter 142a-2 may be formed to have sloped surfaces having acute angles (referential mark "B") gradually going up from a front surface toward a rear surface in the shell body 110. Further, peak points P may be formed at end points of the sloped surfaces of the first supporter 142a-1 and the second supporter 142a-2 to minimize a contact surface with the wafer. The first supporter 142a-1 and the second supporter 142a-2 may be formed to have the same height and sloped surface. The wafer may smoothly slide on the sloped surfaces "B" formed on the first supporter 142a-1 and the second supporter 142a-2 when the wafer is unloaded.

The stopper 144a may be formed on an end of one side of each of the individual slot guides 140a-1 to 140a-n. The stopper 144a may be formed on the innermost end of each of the individual slot guides 140a-1 to 140a-n. The stopper 144a may be formed at the back of the second supporter 142a-2. Since the stopper 144a serves to prevent an unloaded wafer from deviating from the individual slot guide, the wafer may be seated on an appropriate location in each of the individual slot guides 140a-1 to 140a-n by the stopper 144a.

Figure 9:
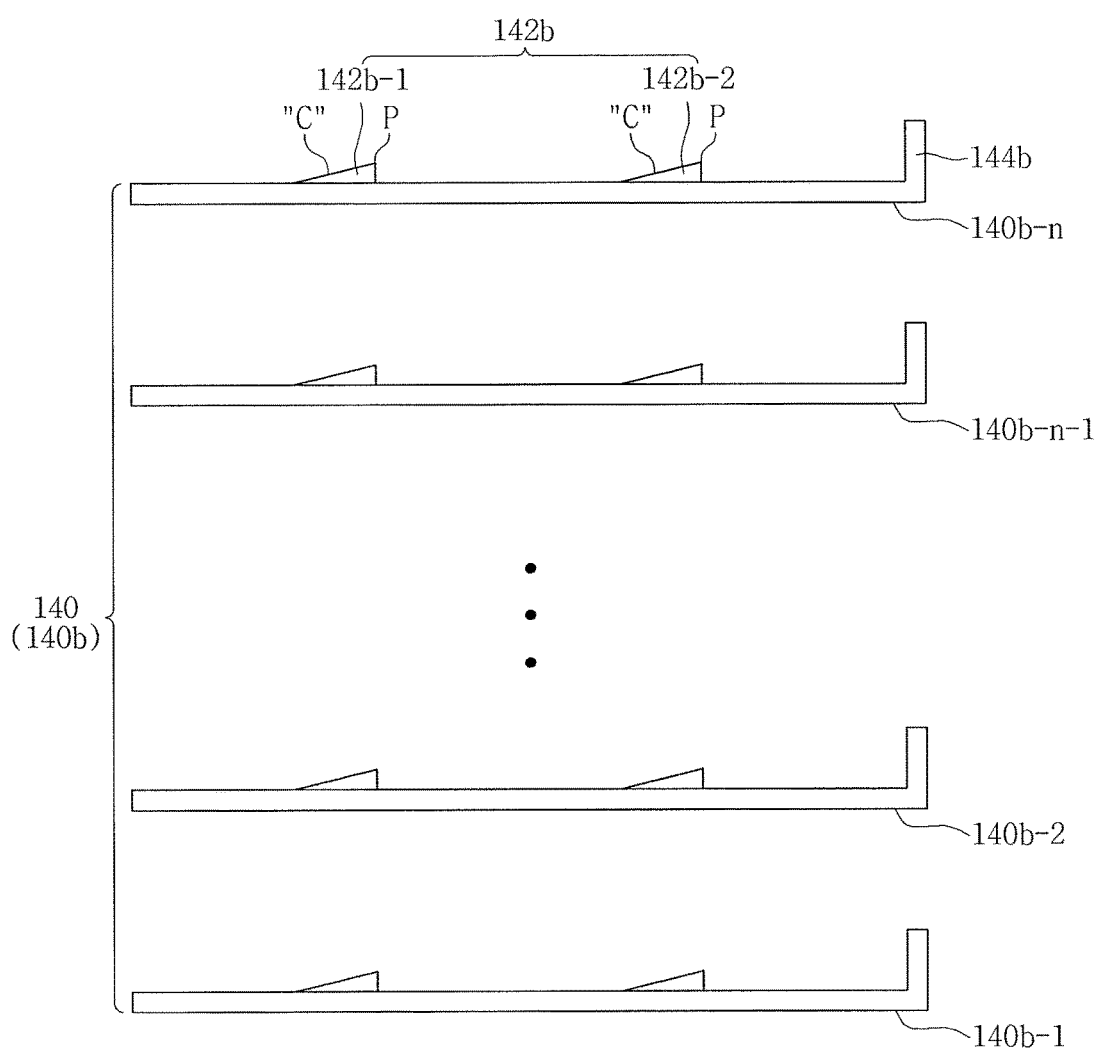
FIG. 9 illustrates a slot structure of another side of the wafer storage container according to an embodiment.

FIG. 9 illustrates a structure of the second slot 140b formed on a second inner wall of the wafer storage container 100.

Referring to FIGS. 3 and 9, the second slot 140b is formed on a second sidewall of the internal space 117 formed by the first side body 111, the second side body 112, the upper body 113, the lower body 114, and the rear body 115. The second slot 140b may include individual slot guides 140b-1 to 140b-n such as the first slot 140a shown in the FIG. 8.

The individual slot guides 140b-1 to 140b-n included in the second slot 140b may be formed to be the same horizontal posture as the individual slot guides 140a-1 to 140a-n included in the first slot 140a shown in the FIG. 8, respectively. Each of the individual slot guides 140b-1 to 140b-n may include the supporter 142b, which supports the wafer, and a stopper 144b.

The supporter 142b may include a first supporter 142b-1 formed adjacent to the wafer entryway 116, where the wafer enters, of the shell body 110, and a second supporter 142b-2 located at the back of the first supporter 142b-1. The supporter 142b may include a plurality of supporters on the slot guide to retain a horizontal posture of the wafer such as the supporter 142a shown in the FIG. 8.

The first supporter 142b-1 and the second supporter 142b-2 may be formed to have sloped surfaces having acute angles (referential mark "C") going up from the wafer entryway 116 where the wafer enters into the shell body 110. Further, peak points P may be formed at end points of the sloped surfaces of the first supporter 142b-1 and the second supporter 142b-2 to minimize a contact surface with the wafer. The first supporter 142b-1 and the second supporter 142b-2 may be formed to have the same height and sloped surface. The wafer may smoothly slide on the sloped surfaces "C" formed on the first supporter 142b-1 and the second supporter 142b-2 when a wafer is unloaded.

Since the first supporter 142a-1 and the second supporter 142a-2 shown in FIG. 8 correspond to the first supporter 142b-1 and the second supporter 142b-2 shown in FIG. 9, respectively, and the four supporters (the first supporter 142a-1, the second supporter 142a-2, the first supporter 142b-1, and the second supporter 142b-2) may be formed to have the same height and sloped surface.

Furthermore, the first supporter 142a-1 in the first slot 140a and the first supporter 142b-1 in the second slot 140b, and the second supporter 142a-2 in the first slot 140a and the second supporter 142b-2 in the second slot 140b may be formed at the same formation locations in addition to having the same height and sloped surface.

The stopper 144b may be formed on an end of one side of each of the individual slot guides 140b-1 to 140b-n. The stopper 144b may be formed on the innermost end of each of the individual slot guides 140b-1 to 140b-n. The stopper 144b may be formed at the back of the second supporter 142b-2. The stopper 144b may be formed in a region which corresponds to the stopper 144a in the first slot 140a shown in FIG. 8.

Since the stopper 144b serves to prevent the unloaded wafer from deviating from the individual slot guide, the wafer may be seated on an appropriate location in each of the individual slot guides 140b-1 to 140b-n by the stopper 144b.

Figure 10:
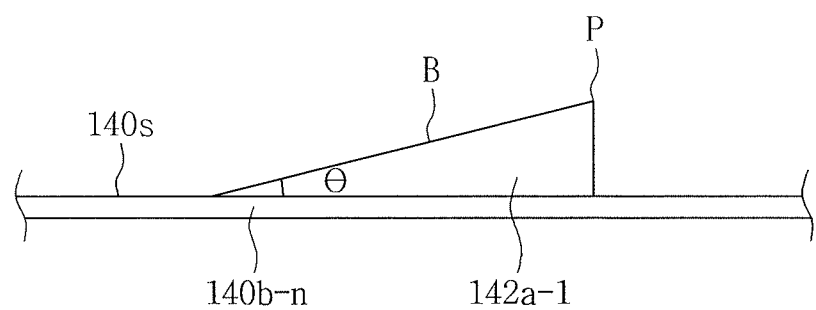
FIG. 10 is an enlarged view of region D in the FIG. 8.

FIG. 10 illustrates an enlarged view of region D in the FIG. 8. Referring to FIGS. 3, 8 and 10, the first supporter 142a-1 may be formed on an upper surface 140s of the individual slot guide 140a-n having the peak point P.

The first supporter 142a-1 may include the sloped surface B gradually going up from the wafer entryway 116 of the shell body 110 toward the rear body 115 of the shell body 110.

The sloped surface B of the first supporter 142a-1 may be formed to retain a certain angle θ with respect to the upper surface 140s of the individual slot guide 140a-n. The certain angle θ may be formed to be less than 90°. The certain angle θ may be formed to be about 45° or less. The sloped surface B of the first supporter 142a-1 may be formed to have a slope which gradually increases from the upper surface 140s of the individual slot guide 140a-n.

A structure of the first supporter 142a-1 may be equally applied to all supporters shown in FIGS. 8 and 9.

Figure 11A:
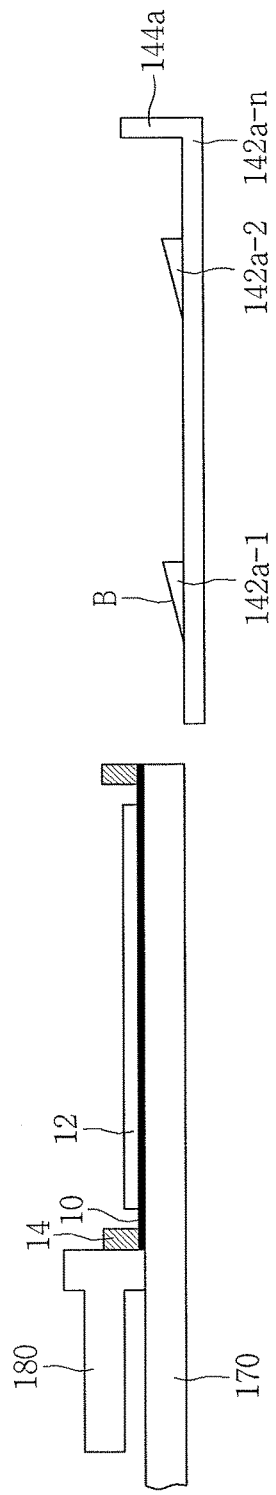
FIGS. 11A to 11C illustrate a process in which a wafer is unloaded into the wafer storage container according to an embodiment.
Figure 11B:
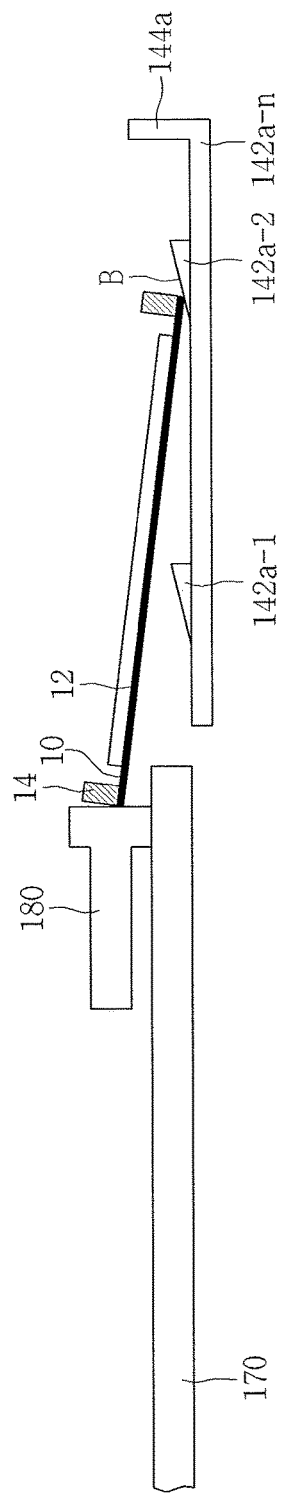
Figure 11C:
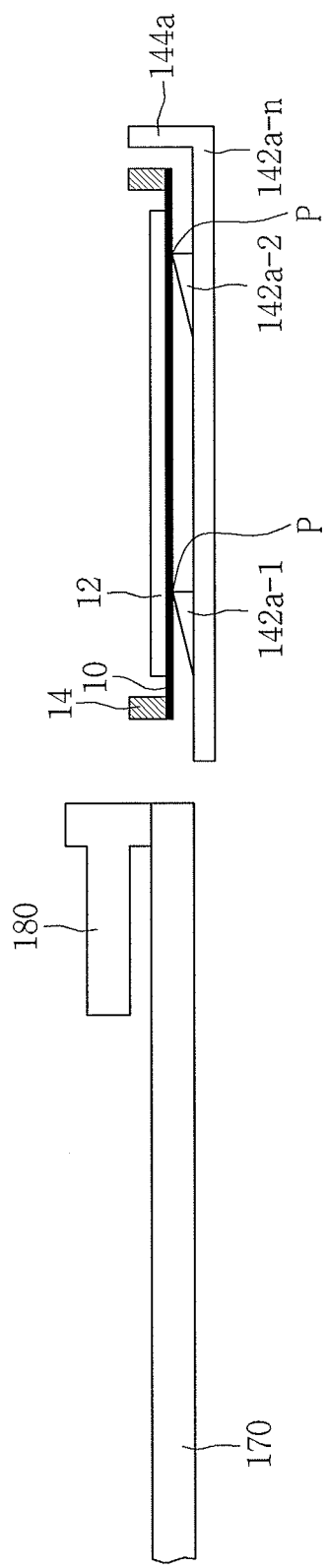

FIGS. 11A to 11C are views for describing a process in which a wafer is unloaded into the wafer storage container 100, and will be described with reference to the tape-frame-type wafer 20 shown in the FIG. 1 and the first slot 140a shown in FIG. 8.

Referring to FIG. 11A, a pusher 180 and a wafer 20, in which a unit process is complete, is located on a rail 170. The wafer 20 may be a tape-frame-type wafer of a 400 mm diameter in which the wafer 12 and a tape frame 14 are apart from each other by a certain space and bonded on a film 10.

The individual slot guide 140a-n, located at the upper-most end among the plurality of the individual slot guides 140a-1 to 140a-n, is located at a side surface of the rail 170. A first supporter 142a-1 and a second supporter 142a-2, which have sloped surfaces B formed of acute angles, and a stopper 144a are formed on the individual slot guide 140a-n.

Referring to FIG. 11B, the pusher 180 located on the rail 170 moves forward and then a tape-frame-type wafer 20 moves to the individual slot guide 140a-n. The wafer 12 moved by the pusher 180 may contact the second supporter 142a-2 after passing over the first supporter 142a-1 on the individual slot guide 140a-n. However, the first supporter 142a-1 and the second supporter 142a-2 are formed to have sloped surfaces B in accordance with the embodiment. As a result, even when the wafer 20 contacts the second supporter 142a-2 while unloading onto the individual slot guide 140a-n, the wafer 20 smoothly slides along the sloped surface B of the second supporter 142a-2.

Referring to FIG. 11C, a tape-frame-type wafer 20 is seated on the individual slot guide 140a-n. The wafer 20 sliding along the sloped surface B of the second supporter 142a-2 moves to a peak P of the second supporter 142a-2 by a pushing force of the pusher 180, and is then horizontally seated on the first supporter 142a-1 and the second supporter 142a-2. The wafer unloading process shown in the FIGS. 11A to 11C is equally performed through the second slot 140b shown in the FIG. 9.

Figure 12:
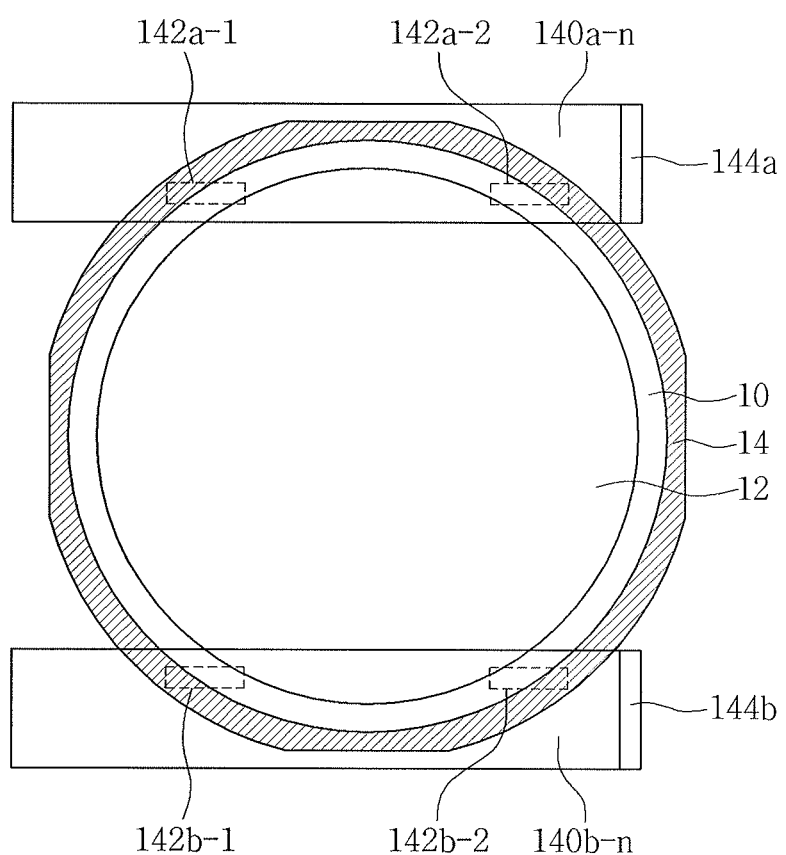
FIG. 12 illustrates a state in which a wafer is seated on a slot in the wafer storage container according to an embodiment.

FIG. 12 illustrates a state in which a tape-frame-type wafer 20 is seated on the first slot 140a and the second slot 140b shown in FIGS. 8 and 9.

Referring to FIG. 12, an individual slot guide 140a-n of the first slot 140a shown in FIG. 8 and an individual slot guide 140b-n of the second slot 140b shown in FIG. 9 are illustrated.

A first supporter 142a-1 and a second supporter 142a-2 are formed on the individual slot guide 140a-n of the first slot 140a, and a first supporter 142b-1 and a second supporter 142b-2 are formed on the individual slot guide 140b-n of the second slot 140b.

The wafer 20 is horizontally supported and seated on the first supporter 142a-1 and the second supporter 142a-2 in the individual slot guide 140a-n, and the first supporter 142b-1 and the second supporter 142b-2 in the individual slot guide 140b-n.

All four supporters 142a-1, 142a-2, 142b-1, and 142b-2, which support the wafer 20, include sloped surfaces having acute angles formed from a direction in which the wafer 20 moves from the outside toward an inside of a shell body. The wafer unloaded into the inside of the shell body may smoothly slide on such sloped surfaces. Thereby, the impact exerted on the wafer may be minimized.

In addition, the wafer 20 is horizontally supported on peak points of the four supporters 142a-1, 142a-2, 142b-1, and 142b-2. Accordingly, a contact area between the wafer 20 and the four supporters 142a-1, 142a-2, 142b-1, 142b-2 may be minimized, and thus, the loss of wafer may be minimized.

As described above, in the wafer storage container 100 according to the embodiment, the four supporters 142a-1, 142a-2, 142b-1, and 142b-2 are formed to have sloped surfaces and peak points. Thus, a wafer unloaded into the shell body smoothly slides, and also the physical impact exerted on the wafer and the resulting wafer damage are reduced by minimizing the contact area between the supporters 142a-1, 142a-2, 142b-1, and 142b-2 and the wafer. Therefore, the loss of wafer may be prevented.

Meanwhile, a general wafer, to which a tape-frame is not bonded, other than such the tape-frame-type wafer 20 may also be unloaded onto a slot of the shell body through the same process shown in the FIGS. 11A to 11C.

FIGS. 13 to 21 are views for describing a wafer storage container 200 in accordance with another embodiment.

Figure 13:
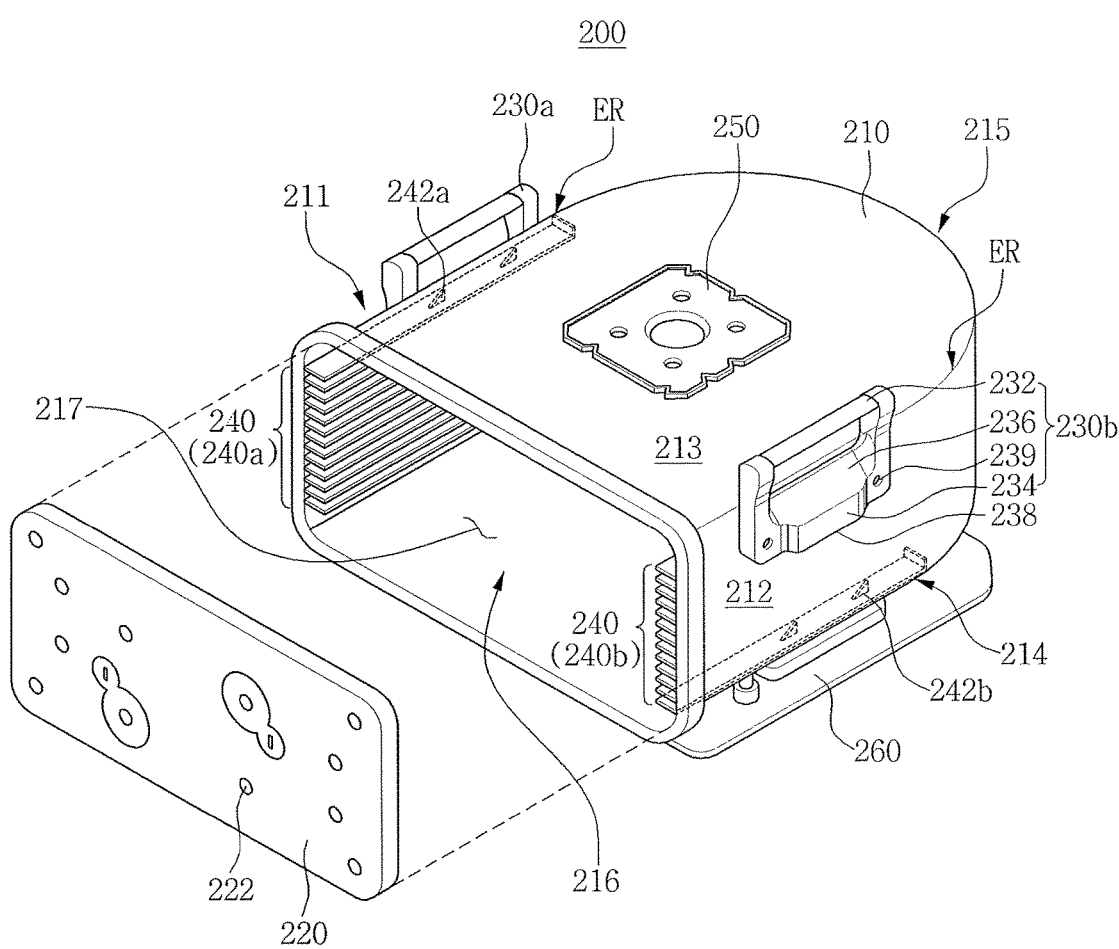
FIG. 13 is an external perspective view of an entire wafer storage container in accordance with an embodiment.
Figure 14:
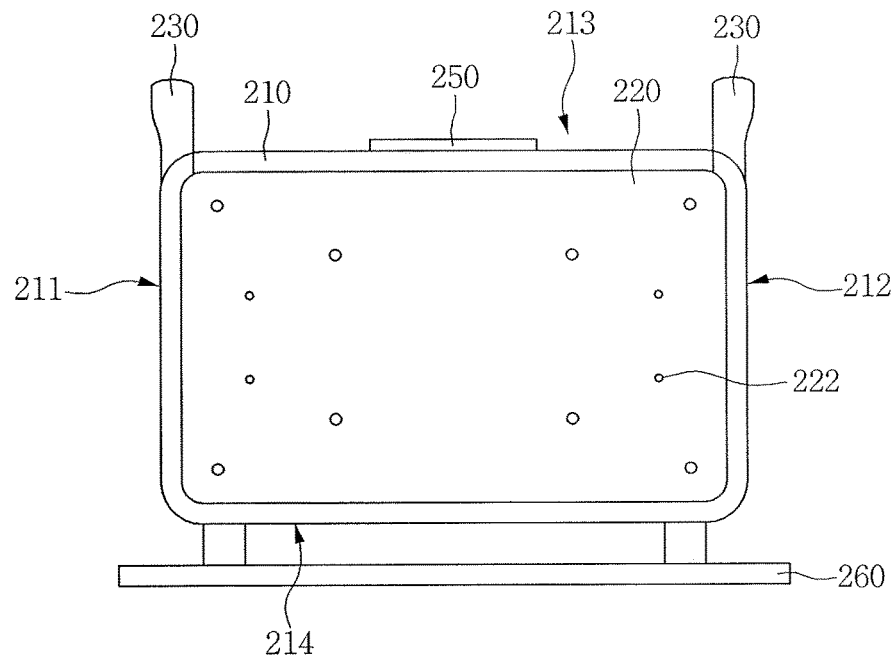
FIG. 14 is a front view of the wafer storage container according to an embodiment.
Figure 15:
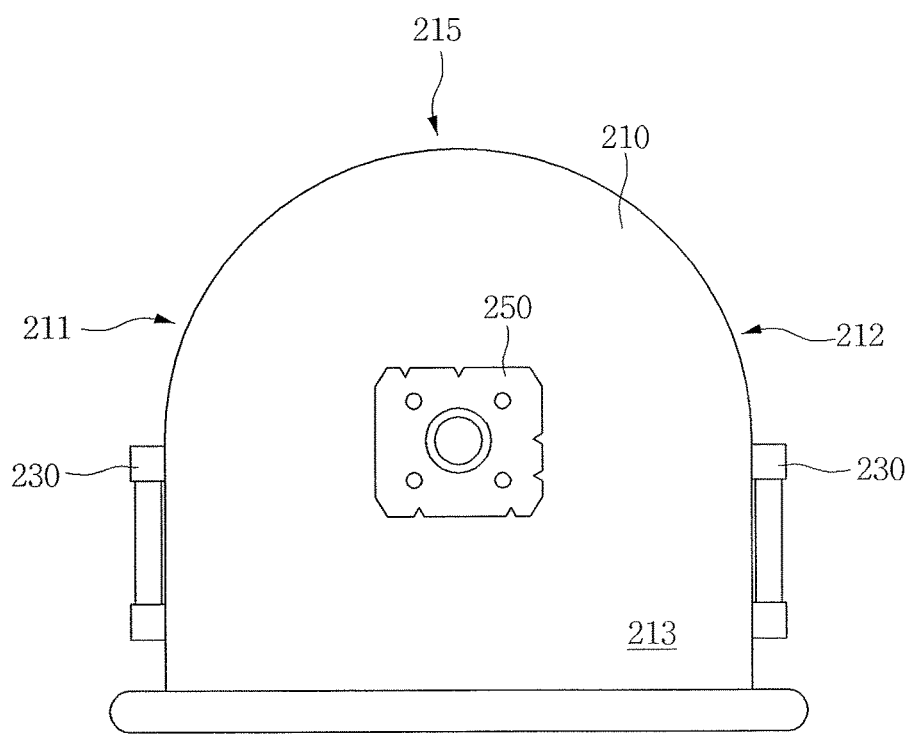
FIG. 15 is a plan view of the wafer storage container according to an embodiment.
Figure 16:
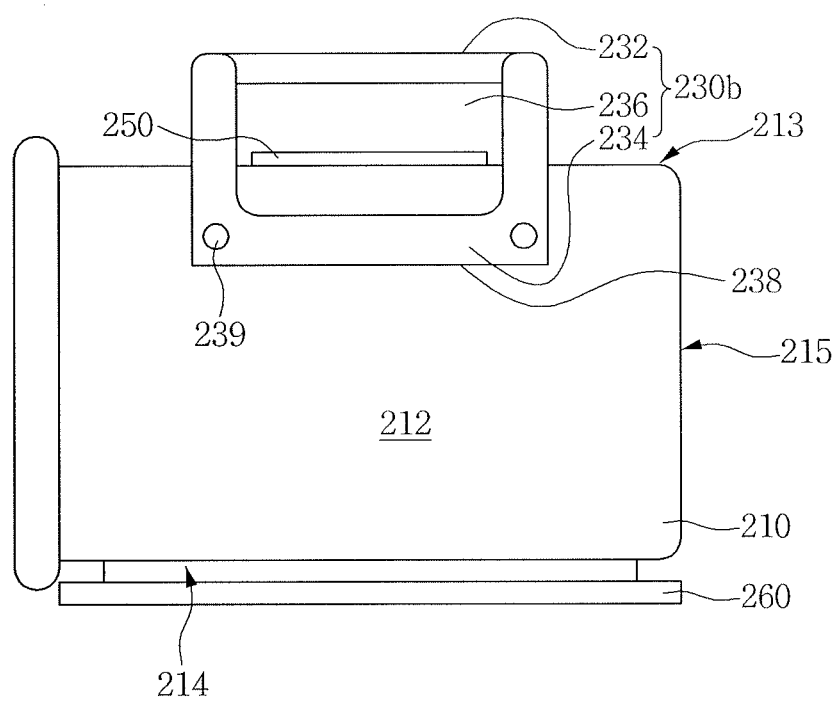
FIG. 16 is a side view of the wafer storage container according to an embodiment.
Figure 17:
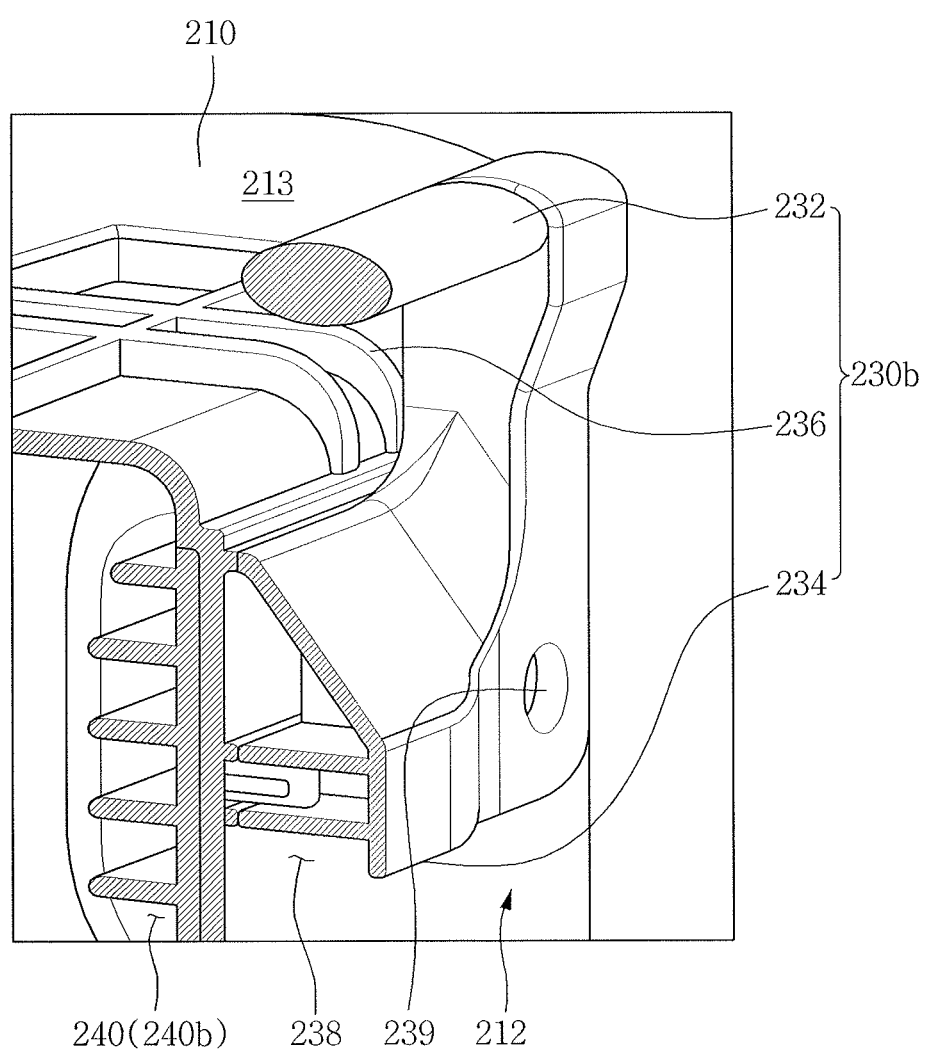
FIG. 17 is an enlarged view of a handler in the wafer storage container according to an embodiment.

FIG. 13 illustrates an external view (perspective view) of the entire wafer storage container 200 in accordance with an embodiment. FIG. 14 illustrates a front view of the wafer storage container 200. FIG. 15 illustrates a plan view of the wafer storage container 200. FIG. 16 illustrates a side view of the wafer storage container 200. FIG. 17 illustrates an enlarged cross sectional view of a handler 230b in the wafer storage container 200.

Referring to FIGS. 1, 2, and 13-17, the wafer storage container 200 according to an embodiment may include a shell body 210, a shell door 220, a first handler 230a, a second handler 230b, and slots 240 (240a, 240b). The wafer storage container 200 may further include a holder 250 and a bottom plate 260.

The shell body 210 may include a first side body 211 and a second side body 212 which are faced and spaced apart from each other. The shell body 210 may include an upper body 213 connected to upper parts of the first side body 211 and the second side body 212. The shell body 210 may include a lower body 214 connected to lower parts of the first side body 211 and the second side body 212. The shell body 210 may include a rear body 215 which defines an internal space 217 together with the first side body 211, the second side body 212, the upper body 213, and the lower body 214.

As the shell door 220 is a device to seal the shell body 210, the shell door 220 may be implemented to be opened by a door switchgear such as a robot arm. The shell door 220 may include a packing process to seal the shell body 210. The shell door 220 may include a plurality of combination members 222 to combine with the robot arm.

The first handler 230a and the second handler 230b may include a main handler 232, a sub-handler 234, and an opening 236. The sub-handler 234 may be combined with the shell body 210, and the main handler 232 may be formed on the sub-handler 234. In the embodiment, the first handler 230a and the second handler 230b may include openings 236. The opening 236 may have closed forms. The first handler 230a and the second handler 230b may be formed on a left side surface and a right side surface of the shell body 210, respectively.

In the embodiment, the terms "left side surface" and "right side surface" may denote side surfaces corresponding to each other in the shell body 110. Embodiments, however, are not limited to terms "left" and "right," and the terms "left side surface" and "right side surface" may refer to as the terms "first side" and "second side," respectively.

The first handler 230a and the second handler 230b may be disposed on upper ends of both side surfaces of the shell body 210. The first handler 230a and the second handler 230b may be formed in edge regions ER where the side surfaces contact the upper surface of the shell body 210.

The first handler 230a may be disposed on the edge region between the upper body 213 and the first side body 211, and formed to protrude from the lower body 214 in a direction of the upper body 213. The second handler 230b may be disposed on the edge region between the upper body 213 and the second side body 212, and formed to protrude from the lower body 214 in the direction of the upper body 213.

The main handlers 232 included in the first handler 230a and the second handler 230b may have bar shapes which may be gripped by an operator. The main handlers 232 having the bar shapes may be gripped by an operator's hand through the opening 236. The main handlers 232 included in the first handler 230a and the second handler 230b may be formed to have equal or similar heights to the upper body 213 of the shell body 210, or to protrude above the surface of the upper body 213 of the shell body 210 in order to maximize a space where the operator's hand passing through the opening 236 may be positioned.

The sub-handlers 234 in the first handler 230a and the second handler 230b are used when the main handlers 232 are not easy to use, and may be formed under the main handlers 232 based on the openings 236. The sub-handler 234 may be formed at a location, to which a joint 239 is combined to fix the main handler 232 on a side surface of shell body 210, to obtain a space such as a groove 238, where an operator may handle the shell body 210 from the side surface of the shell body 210, and where the shell body 210 may be handled by a method of inserting the operator's hand into the groove 238.

The slot 240 may include a first slot 240a and a second slot 240b which are formed on a left side surface and a right side surface of an inside of the shell body 210, respectively. The first slot 240a and the second slot 240b may include a plurality of individual slot guides formed to be horizontal to each other.

Each of the individual slot guides in the first slot 240a and the second slot 240b may include a plurality of supporters 242a and 242b having sloped surfaces of acute angles. A structure of the slot 240 having the supporters 242a and 242b will be described later through FIGS. 18 and 19 in more detail.

The holder 250 may be formed at a center of an upper surface of the shell body 210. The holder 250 may be combined with a transfer system such as a manual transfer system, e.g., a PGV, or an auto transfer system, e.g., an OHT, an OHC, an AGV, etc.

The bottom plate 260 may be formed in a lower part region in the shell body 210. The bottom plate 260 may be a fixing device which may fix the wafer storage container 200 to a load port.

FIG. 17 illustrates an enlarged cross sectional view of the second handler 230b in the wafer storage container 200.

Referring to FIG. 17, it illustrates a part of one side (right side) of the shell body 210 based on the FIG. 13. The second slot 240b, which is one of slots 240 where a wafer is seated, located at an inner wall and the right side of the shell body 210 is illustrated.

The second handler 230b may include the main handler 232, the sub-handler 234, the opening 236, the groove 238, and the joint 239.

The sub-handler 234 may be formed in a region where the joint 239 is combined with the shell body 210, and the main handler 232 may be formed above the sub-handler 234.

The second handler 230b may be disposed on an edge region between the upper body 213 and the second side body 212 in shell body 210. The second handler 230b may have a parallel part with the second side body 212.

The main handler 232 is a region directly gripped by using an operator's hand to move the wafer storage container 200 when performing a manufacturing process of a semiconductor device. Accordingly, the main handler 232 may have a bar type having a circular or elliptical shape, which has no edges, in order to prevent damage to the operator's hand by a heavy weight of the wafer storage container 200 and to have improved grip comfort.

The main handler 232 may be gripped by the operator's hand through the opening 236. The main handler 232 may be formed to have an equal or similar height to the upper body 213 of the shell body 210, or to protrude above the surface of the upper body 213 of the shell body 210 in order to maximize a space where the operator's hand passing through the opening 236 may be positioned.

As the sub-handler 234 may be used when the main handler 232 is not easy to use (e.g., after packing the wafer storage container 200), the sub-handler 234 may be formed under the main handler 232 based on the opening 236. The sub-handler 234 may be formed at a location in which a joint 239 is combined to fix the first handler 230a on the side surface of shell body 210, and formed to obtain a space such as a groove 238 where the operator's hand is inserted, and where an operator may handle from the side surface of the shell body 210.

As described above, in the wafer storage container 200 according to an embodiment, sizes of the handlers 230a and 230b become to have a small portion of the size of the entire wafer storage container 200 by disposing the handlers 230a and 230b, which move the wafer storage container 200, in the edge regions between the side bodies 211 and 212 and the upper body 213 in the shell body 210. As the result, even when a size of the shell body 210, in which a wafer is stored, increases, caused by an increase in a size of the wafer, it prevents an increase in the external size of the entire wafer storage container 200 including the shell body 210 and the handlers 230a and 230b by reducing the sizes of the handlers 230a and 230b. Therefore, a manual operation by the operator may be easily performed and an additional equipment investment cost may also be reduced by increasing compatibility with conventional equipment.

Figure 18:
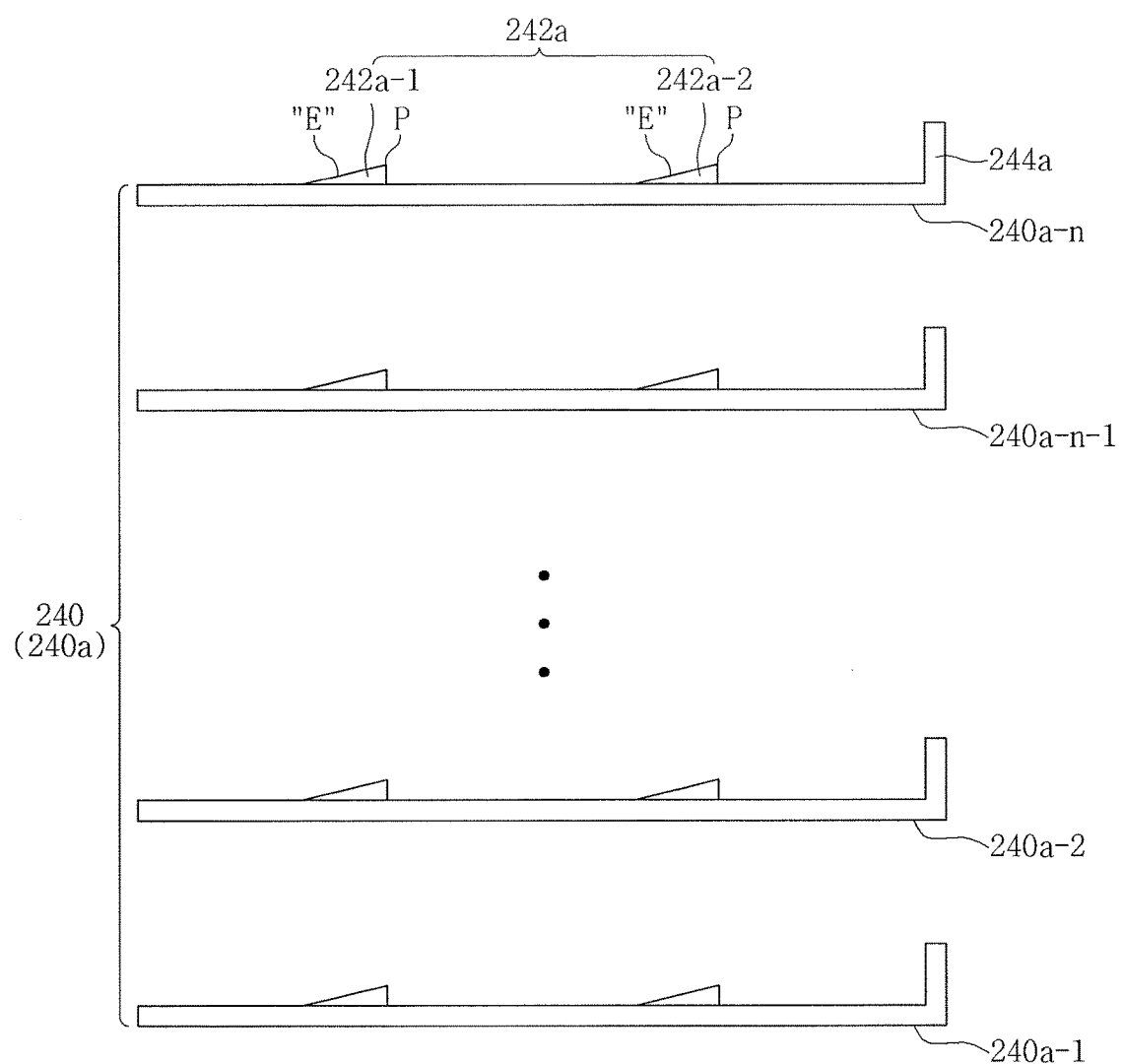
FIG. 18 illustrates a slot structure of one side of the wafer storage container according to an embodiment.
Figure 19:
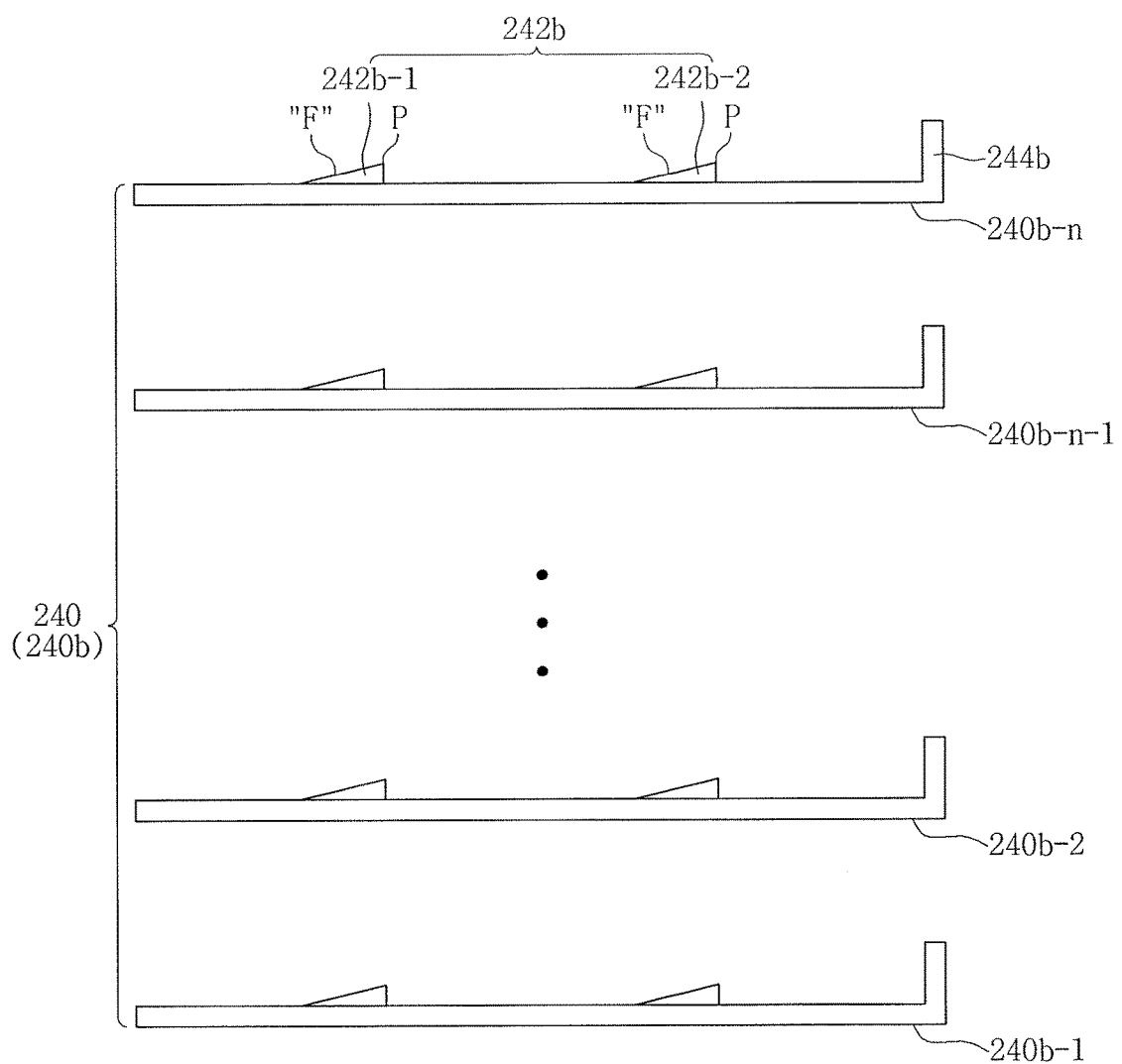
FIG. 19 illustrates a slot structure of another side of the wafer storage container according to an embodiment.

FIGS. 18 and 19 illustrate structures of the first slot 240a and the second slot 240b formed on both inner walls of the wafer storage container 200.

Referring to FIGS. 13 and 18, the first slot 240a is formed on a first sidewall of the internal space 217 formed by the first side body 211, the second side body 212, the upper body 213, the lower body 214, and the rear body 215. The first slot 240a may include individual slot guides 240a-1 to 240a-n based on a weight of a wafer to be unloaded.

Each of the individual slot guides 240a-1 to 240a-n may include a supporter 242a, which supporters the wafer, and a stopper 244a. The supporter 242a may include a first supporter 242a-1 formed adjacent to a front surface, where the wafer enters, of the shell body, and a second supporter 242a-2 located at the back of the first supporter 242a-1. The supporter 242a may include a plurality of supporters on the slot guide to retain a horizontal posture of the wafer.

The first supporter 242a-1 and the second supporter 242a-2 may be formed to have sloped surfaces having acute angles (referential mark "E") gradually going up from a front surface toward a rear surface in the shell body 210. Further, peak points P may be formed at end points of the sloped surfaces of the first supporter 242a-1 and the second supporter 242a-2 to minimize a contact surface with the wafer. The first supporter 242a-1 and the second supporter 242a-2 may be formed to have the same height and sloped surface. The wafer may smoothly slide on the sloped surfaces "E" formed on the first supporter 142a-1 and the second supporter 142a-2 when the wafer is unloaded.

The stopper 244a may be formed on an end of one side of each of the individual slot guides 240a-1 to 240a-n. The stopper 244a may be formed on the innermost end of each of the individual slot guides 240a-1 to 240a-n. The stopper 244a may be formed at the back of the second supporter 242a-2. Since the stopper 244a serves to prevent the unloaded wafer from deviating from the individual slot guide, the wafer may be seated on an appropriate location in each of the individual slot guides 240a-1 to 240a-n by the stopper 244a.

Referring to FIGS. 13 and 19, the second slot 240b is formed on a second sidewall of the internal space 217 formed by the first side body 211, the second side body 212, the upper body 213, the lower body 214, and the rear body 215. The second slot 240b may include the individual slot guides 240b-1 to 240b-n such as the first slot 240a shown in the FIG. 18.

The individual slot guides 240b-1 to 240b-n included in the second slot 140b may be formed to be the same horizontal postures as the individual slot guides 240a-1 to 240a-n included in the first slot 240a shown in the FIG. 18, respectively. Each of the individual slot guides 240b-1 to 240b-n may include the supporter 242b, which supporters a wafer, and a stopper 244b.

The supporter 242b may include a first supporter 242b-1 formed adjacent to the wafer entryway 216, where the wafer enters, of the shell body 210, and a second supporter 242b-2 located at the back of the first supporter 242b-1. The supporter 242b may include a plurality of supporters on the slot guide to retain a horizontal posture of the wafer such as the supporter 142a shown in the FIG. 18.

The first supporter 242b-1 and the second supporter 242b-2 may be formed to have sloped surfaces having acute angles (referential mark "F") gradually going up from a front surface toward a rear surface in the shell body 210. Further, peak points P may be formed at end points of the sloped surfaces of the first supporter 242b-1 and the second supporter 242b-2 to minimize a contact surface with the wafer. The first supporter 242b-1 and the second supporter 242b-2 may be formed to have the same height and sloped surface. The wafer may smoothly slide on the sloped surfaces "E" formed on the first supporter 142a-1 and the second supporter 142a-2 when a wafer is unloaded.

Furthermore, since the first supporter 242a-1 and the second supporter 142a-2 shown in FIG. 18 correspond to the first supporter 242b-1 and the second supporter 242b-2 shown in FIG. 19, respectively, they may be formed at the same formation locations in addition to having the same heights and sloped surfaces.

The stopper 244b may be formed on an end of one side of each of the individual slot guides 240b-1 to 240b-n. The stopper 244b may be formed on the innermost end of the each of the individual slot guides 240b-1 to 240b-n. The stopper 244b may be formed at the back of the second supporter 242b-2. The stopper 244b may be formed in a region so as to be symmetrical to the stopper 244a located on the first slot 240a shown in FIG. 18. Since the stopper 244b serves to prevent that an unloaded wafer from deviating from the individual slot guide, the wafer may be seated on an appropriate location in the individual slot guides 240b-1 to 240b-n by the stopper 244b.

The sloped surfaces E and F of all the supporters 242a-1, 242a-2, 242b-1, and 242b-2 located on the first slot 240a and the second slot 240b shown in the FIGS. 18 and 19 may be formed to retain a certain angle θ with respect to the upper part surfaces of the slot guides 240a and 240b as the same as the supporters shown in the FIG. 10. The certain angle θ may be formed to be less than 90°. The certain angle θ may be formed to be about 45° or less.

The sloped surfaces E and F of all the supporters 242a-1, 242a-2, 242b-1, and 242b-2 located on the first slot 240a and the second slot 240b shown in the FIGS. 18 and 19 may be formed to have slopes which gradually increase from the upper part surfaces of the slot guides 240a and 240b as the same as the supporters shown in the FIG. 10.

Figure 20C:
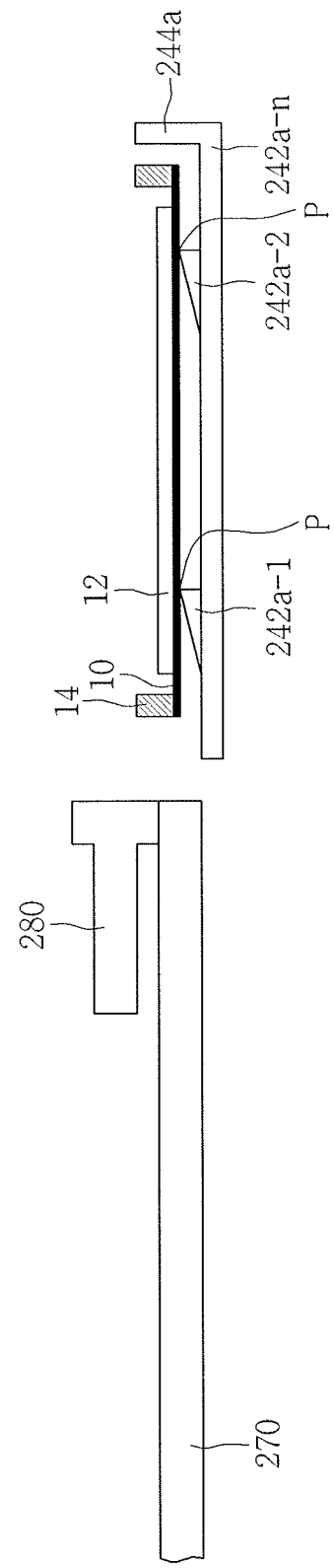

FIGS. 20A to 20C are views for describing processes in which a wafer is unloaded into the wafer storage container 200 and will be described with reference to the tape-frame-type wafer 20 in the FIG. 1 and the first slot 240a in FIG. 18.

Referring to FIG. 20A, a pusher 280 and a wafer 20 which has complete a unit process is located on a rail 270. The wafer 20 may be a tape-frame-type wafer in which the wafer 12 and a tape frame 14 are apart from each other by a certain space and bonded on a film 10.

The individual slot guide 240a-n, located at the uppermost end among the plurality of the individual slot guides 240a-1 to 240a-n, is located at a side surface of the rail 270. A first supporter 242a-1 and a second supporter 242a-2, which have sloped surfaces E formed of acute angles, and a stopper 244a are formed on the individual slot guide 240a-n.

Referring to FIG. 20B, the pusher 280 located on the rail 270 moves forward and then the tape-frame-type wafer 20 moves to the individual slot guide 240a-n. The wafer 12 moved by the pusher 280 may contact the second supporter 242a-2 after passing over the first supporter 242a-1 on the individual slot guide 240a-n. However, the first supporter 242a-1 and the second supporter 242a-2 are formed to have sloped surfaces E in accordance with the embodiment. As a result, even when the wafer 20 contacts the second supporter 242a-2 while unloading onto the individual slot guide 140a-n, the wafer 20 smoothly slides along the sloped surface E of the second supporter 242a-2.

Referring to FIG. 20C, a tape-frame-type wafer 20 is seated on the individual slot guide 240a-n. The tape-frame-type wafer 20 sliding along the sloped surface E of the second supporter 242a-2 moves to a peak P of the second supporter 242a-2 by a pushing force of the pusher 280, and is then horizontally seated on the first supporter 242a-1 and the second supporter 242a-2. The wafer unloading process in the FIGS. 20A to 20C is also simultaneously performed through the second slot 240b shown in the FIG. 19.

Figure 21:
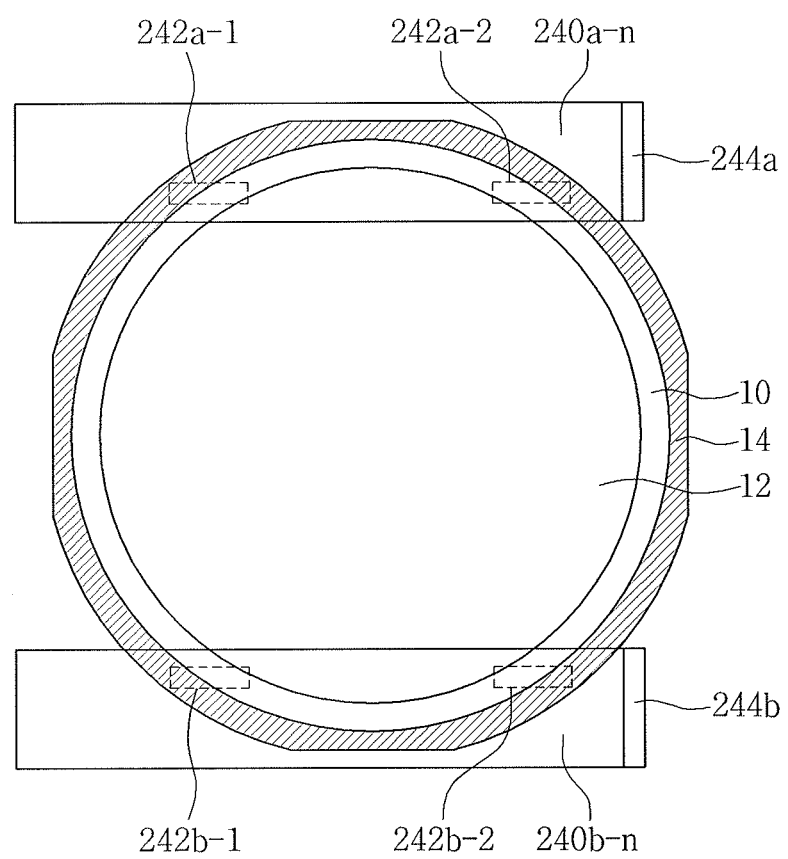
FIG. 21 illustrates a state in which a wafer is seated on a slot in the wafer storage container according to an embodiment.

FIG. 21 illustrates a state in which the tape-frame-type wafer 20 is seated on the first slot 240a and the second slot 240b described in FIGS. 18 and 19.

Referring to FIG. 21, the individual slot guide 240a-n formed on the uppermost part in the first slot 240a shown in the FIG. 18, and the individual slot guide 240b-n formed on the uppermost part in the second slot 240b shown in the FIG. 19 are illustrated. The first supporter 242a-1 and the second supporter 242a-2 are formed on the individual slot guide 240a-n in the first slot 240a, and the first supporter 242b-1 and the second supporter 242b-2 are formed on the individual slot guide 240b-n in the second slot 240b.

The wafer 20 is horizontally supported and seated on the first supporter 242a-1 and the second supporter 242a-2 in the individual slot guide 240a-n, and the first supporter 242b-1 and the second supporter 242b-2 in the individual slot guide 240b-n.

All four supporters 142a-1, 142a-2, 142b-1, and 142b-2, which support the wafer 20, include sloped surfaces having acute angles formed from a direction in which the wafer 20 moves from the outside toward an inside of a shell body. The wafer unloaded into the inside of the shell body may smoothly slide on such the sloped surfaces. Thereby, the impact exerted on the wafer may be minimized.

In addition, the wafer 20 is horizontally supported on peak points of the four supporters 142a-1, 142a-2, 142b-1, and 142b-2. Accordingly, a contact area between the wafer 20 and the four supporters 142a-1, 142a-2, 142b-1, 142b-2 may be minimized, and thus, the loss of wafer may be minimized.

As described above, in the wafer storage container 200 according to the embodiment, the four supporters 142a-1, 142a-2, 142b-1, and 142b-2 are formed to have the sloped surfaces and the peak points. Thus, the wafer unloaded into the shell body smoothly slides, and also the physical impact exerted on the wafer and the resulting wafer damage are reduced by minimizing the contact area between the supporters 142*a*-1, 142*a*-2, 142*b*-1, and 142*b*-2 and the wafer. Therefore, the loss of wafer may be prevented.

A general wafer, to which a tape-frame is not bonded, other than such the tape-frame-type wafer 20 may also be unloaded onto a slot of the shell body through the same process shown in the FIGS. 20A to 20C.

As described above, in the wafer storage container according to embodiments, sizes of the handlers become to have a small portion of the size of the entire wafer storage container by forming the handlers of the wafer storage container in a vertical direction in the edge regions between the side bodies and the upper body in the shell body. As a result, even when a size of the shell body, in which a wafer is stored, increases as a result of an increase in a size of the wafer, it can prevent an increase in the external size of the entire wafer storage container including the shell body and the handlers by reducing the sizes of the handlers.

Furthermore, since the entire external size of the wafer storage container does not increase, a logistics automation system may be implemented by increasing compatibility with the OHT in which the wafer storage container capable of storing a wafer of a 300 mm diameter is applied. Thus, an additional equipment investment cost can be reduced.

Furthermore, since the entire external size of the wafer storage container does not increase, even when the wafer storage container is loaded into a load port to perform a unit process, occurrences, such as contact caused by a narrow space or interference when transferring by an OHT, can be solved by obtaining a manual operation space for an operator from the adjacent wafer storage container.

Furthermore, in the embodiment, since the supporters formed on the slot are formed to have sloped surfaces to be useful for wafer sliding when the slot configured to seat a wafer is formed, occurrences of trapping the wafer by the supporters can be solved and the loss of wafer can also be prevented.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the embodiments as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A wafer storage container, comprising:
   a shell body including:
      a first side body and a second side body that face each other and are spaced apart from each other,
      an upper body connected with upper parts of the first side body and the second side body,
      a rear body connected with an end of one side of each of the first side body and the second side body, and
      a lower body connected with lower parts of the first side body and the second side body, and the lower body defining an internal space together with the first side body, the second side body, the upper body, and the rear body;
   a holder on the upper body;
   a first handler on an edge region between the upper body and the first side body, the first handler protruding from the lower body in a direction of the upper body;
   a second handler on an edge region between the upper body and the second side body, the second handler protruding from the lower body in the direction of the upper body;
   a first slot on a first inner wall of the first side body exposed by the internal space; and
   a second slot on a second inner wall of the second side body exposed by the internal space, each of the first slot and the second slot including a plurality of individual slot guides and a plurality of supporters on the individual slot guides.

2. The wafer storage container of claim 1, wherein each of the first handler and the second handler includes a sub-handler combined with the shell body, and a main handler located above the sub-handler.

3. The wafer storage container of claim 2, further comprising an opening between the main handler and the sub-handler, the main handler having a bar shape, which is to be gripped by an operator's hand, through the opening.

4. The wafer storage container of claim 3, wherein the sub-handler has a shape of a groove at a lower part of the main handler relative to the opening.

5. The wafer storage container of claim 2, wherein the main handler is at a height above a surface of the upper body of the shell body.

6. The wafer storage container of claim 1, wherein the first handler and the second handler are parallel with the first side body and the second side body, respectively.

7. The wafer storage container of claim 1, wherein each of the supporters has a sloped surface gradually inclining from a wafer entryway of the shell body toward the rear body of the shell body.

8. The wafer storage container of claim 7, wherein each of the supporters retains a predetermined angle relative to a surface of a corresponding individual slot guide.

9. The wafer storage container of claim 8, wherein each of the supporters having the sloped surfaces has a peak point to minimize a contact surface with a wafer.

10. A wafer storage container, comprising:
    a shell body including:
       a first side body and a second side body that face each other and are spaced apart from each other,
       an upper body connected with upper parts of the first side body and the second side body,
       a rear body connected with an end located on one side of each of the first side body and the second side body, and
       a lower body connected with lower parts of the first side body and the second side body, the lower body defining an internal space with the first side body, the second side body, the upper body, and the rear body;
    a holder on the upper body;
    a first handler on an edge region between the upper body and the first side body, the first handler protruding from the lower body in a direction of the upper body;
    a second handler on an edge region between the upper body and the second side body, the second handler protruding from the lower body in the direction of the upper body;

a first slot on a first inner wall of the first side body exposed by the internal space; and a second slot on a second inner wall of the second side body exposed by the internal space, each of the first slot and the second slot including a plurality of individual slot guides and a plurality of supporters on the individual slot guide, and each of the supporters having a sloped surface gradually inclining from a wafer entryway of the shell body toward the rear body of the shell body.

11. The wafer storage container of claim 10, wherein each of the supporters has a same height and sloped surface.

12. The wafer storage container of claim 10, wherein the sloped surface of each of the supporters retains a predetermined angle relative to a surface of a corresponding individual slot guide.

13. The wafer storage container of claim 12, wherein each of the supporters on the individual slot guides has a peak point, which minimizes a contact surface with a wafer, at an end of the sloped surface.

14. The wafer storage container of claim 10, further comprising a stopper at an end of each of the individual slot guides, the stopper being capable of preventing a wafer, unloaded into the shell body, from deviating from the individual slot guide.

15. The wafer storage container of claim 10, wherein each of the first handler and the second handler includes a sub-handler combined with the shell body, and a main handler above the sub-handler, and the main handler being at a height above a surface of the upper body of the shell body.

16. A wafer storage container, comprising:
a shell body;
a first slot on a first inner wall of the shell body; and
a second slot on a second inner wall of the shell body, each of the first slot and the second slot including a plurality of individual slot guides and a plurality of supporters on the individual slot guide, and each of the supporters having a sloped surface gradually inclining from a wafer entryway of the shell body toward the rear body of the shell body,
wherein each supporter includes a base surface on a corresponding slot guide, the sloped surface extending from the base surface at a predetermined inclination angle, and a rear surface connecting the sloped surface with the base surface, and
wherein a length of the sloped surface of each supporter is longer than the rear surface.

17. The wafer storage container of claim 16, wherein the predetermined inclination angle is smaller than an angle between the sloped surface and the rear surface, the predetermined inclination angle of the sloped surface being about 45 degree or less.

18. The wafer storage container of claim 16, wherein each of the supporters having the sloped surfaces has a peak point minimizing a contact surface with a wafer.

19. The wafer storage container of claim 16, wherein each of the supporters has a same height.

20. The wafer storage container of claim 16, wherein each of the individual slot guides further includes a stopper capable of preventing a wafer, unloaded into the shell body, from deviating from the individual slot guide.

* * * * *